US009305045B1

(12) United States Patent
Cohen et al.

(10) Patent No.: US 9,305,045 B1
(45) Date of Patent: *Apr. 5, 2016

(54) DATA-TEMPERATURE-BASED COMPRESSION IN A DATABASE SYSTEM

(71) Applicant: Teradata US, Inc, Dayton, OH (US)

(72) Inventors: Steven B Cohen, Redondo Beach, CA (US); John R Catozzi, San Diego, CA (US)

(73) Assignee: Teradata US, Inc., Dayton, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/040,909

(22) Filed: Sep. 30, 2013

Related U.S. Application Data

(60) Provisional application No. 61/709,143, filed on Oct. 2, 2012.

(51) Int. Cl.
*G06F 17/30* (2006.01)
*H03M 7/30* (2006.01)

(52) U.S. Cl.
CPC .... *G06F 17/30339* (2013.01); *G06F 17/30303* (2013.01); *H03M 7/6094* (2013.01)

(58) Field of Classification Search
CPC .............. G06F 17/30339; G06F 2212/401; G06F 17/30303; G06F 17/30306; G06F 11/3082; G06F 3/0608; H03M 7/30
USPC ........................................................ 707/693
See application file for complete search history.

(56) References Cited

U.S. PATENT DOCUMENTS

| 8,478,731 | B1* | 7/2013 | Throop et al. ................ 707/693 |
| 2002/0101711 | A1* | 8/2002 | Gold ............................. 361/685 |
| 2007/0208893 | A1* | 9/2007 | Azzarello et al. ............... 710/68 |
| 2008/0133573 | A1* | 6/2008 | Haft et al. ..................... 707/102 |
| 2008/0162523 | A1* | 7/2008 | Kraus et al. ................... 707/101 |
| 2009/0043734 | A1* | 2/2009 | Barsness et al. .................. 707/3 |
| 2009/0043792 | A1* | 2/2009 | Barsness et al. ............. 707/101 |
| 2009/0043793 | A1* | 2/2009 | Barsness et al. ............. 707/101 |
| 2009/0193042 | A1* | 7/2009 | Hornibrook et al. .......... 707/101 |
| 2010/0030797 | A1* | 2/2010 | Johnson et al. ............... 707/101 |
| 2010/0153375 | A1* | 6/2010 | Bilas et al. .................... 707/723 |

OTHER PUBLICATIONS

Long, New Options for Compression, 2010.*
Kubo, Multi-Temperature Data Warehousing, Aug. 24, 2012.*
Mike Stonebraker et al., "C-Store: A column-oriented DBMS", Proceedings of the 31st VLDB Conference, Trondheim, Norway, 2005 (12 pages).
Daniel J. Abadi et al., "Column-Stores vs. Row-Stores:How Different Are they Really?", In Proceedings of SIGMOD, 2008 (14 pages).

(Continued)

*Primary Examiner* — William Spieler
(74) *Attorney, Agent, or Firm* — Randy L. Campbell, Jr.

(57) ABSTRACT

A database system may include a storage array including a plurality of storage devices configured to store database data. The database system may further include a processor in communication with the memory device. The processor may be further configured to determine usage frequency of the database data. The processor may be configured to select a subset of the database data for compression based on the usage frequency. The processor may be further configured to perform the compression of the selected subset of the database data. A method and computer-readable medium may also be implemented.

20 Claims, 4 Drawing Sheets

(56) References Cited

OTHER PUBLICATIONS

Oracle, "A Technical Overview of the Oracle Exadata Database Machine and Exadata Storage Server", An Oracle White Paper, Apr. 2011 (31 pages).

Netezza, "The Netezza Fast Engines Framework", White Paper, 2007 (12 pages).

B.A. Marron et al., "Automatic Data Compression", Communications of the ACM, vol. 10, Issue 11, pp. 711-715, 1967.

IBM, Product Overviews for DB2 9.5: Data Compression Dictionary is Created Automatcally, available at hhttp://www-01.ibm.com/support/knowledgecenter/#!/SSEPGG_9.5.0/com.ibm.db2.luw.wn.doc/doc/i0052339.html on Aug. 18, 2015 (1 page).

* cited by examiner

DATA-TEMPERATURE-BASED COMPRESSION IN A DATABASE SYSTEM

CLAIM OF PRIORITY

This application claims the benefit of priority under 35 U.S.C. §119(e) of U.S. Provisional Patent Application 61/709,143 filed on Oct. 2, 2012, the entirety of which is incorporated by reference herein.

BACKGROUND

1. Technical Field

The present disclosure relates generally to database systems, and in particular, to data-temperature-based compression of database data.

2. Related Art

A database is a collection of stored data that is logically related and that is accessible by one or more users or applications. A popular type of database is the relational database management system (RDBMS), which includes relational tables, also referred to as relations, made up of rows and columns (also referred to as tuples and attributes). Each row represents an occurrence of an entity defined by a table, with an entity being a person, place, thing, or other object about which the table contains information.

Storage devices used for database data storage are growing in capacity and decreasing in price thereby offering an ever decreasing cost per gigabyte (GB). Despite this, customer demand for even greater storage capacity at an even lesser price is driving adoption of wholesale compression of tables in order to provide for this need. Current forms of compression typically implement wholesale compression of an entire database table that require substantial amounts of central processing unit cost that is added to any query that accesses these compressed tables. Also, the database administrators must maintain a list of all of the database tables which might want to be compressed and/or uncompressed and manually cause this to happen at the appropriate points in the lifetime of the table.

SUMMARY

According to one aspect of the present disclosure, a database system may include a storage array including a plurality of storage devices configured to store database data. The database system may further include a processor in communication with the memory device. The processor may be configured to determine usage frequency of the database data. The processor may be configured to select a subset of the database data for compression based on the usage frequency. The processor may be further configured to perform the compression of the selected subset of the database data.

According to another aspect of the present disclosure, a method of operating a database system may include determining usage frequency of database data stored in a storage array comprising a plurality of storage devices. The method may further include selecting a subset of the database data for compression based on the usage frequency. The method may further include performing the compression of the selected subset of the database data.

According to another aspect of the present disclosure, a computer-readable medium may be encoded with instructions executable by a processor. The computer-readable medium may include instructions to determine usage frequency of database data stored in a storage array comprising a plurality of storage devices. The computer-readable medium may further include instructions to select a subset of the database data for compression based on the usage frequency. The computer-readable medium may further include instructions to perform the compression of the selected subset of the database data.

The various aspects of the disclosure may be implemented as a system, method, or instructions stored on computer-readable media or may be implemented as a combination thereof.

BRIEF DESCRIPTION OF THE DRAWINGS

The disclosure may be better understood with reference to the following drawings and description. The components in the figures are not necessarily to scale, emphasis instead being placed upon illustrating the principles of the disclosure. Moreover, in the figures, like referenced numerals designate corresponding parts throughout the different views.

DETAILED DESCRIPTION OF THE DRAWINGS

Figure 1:
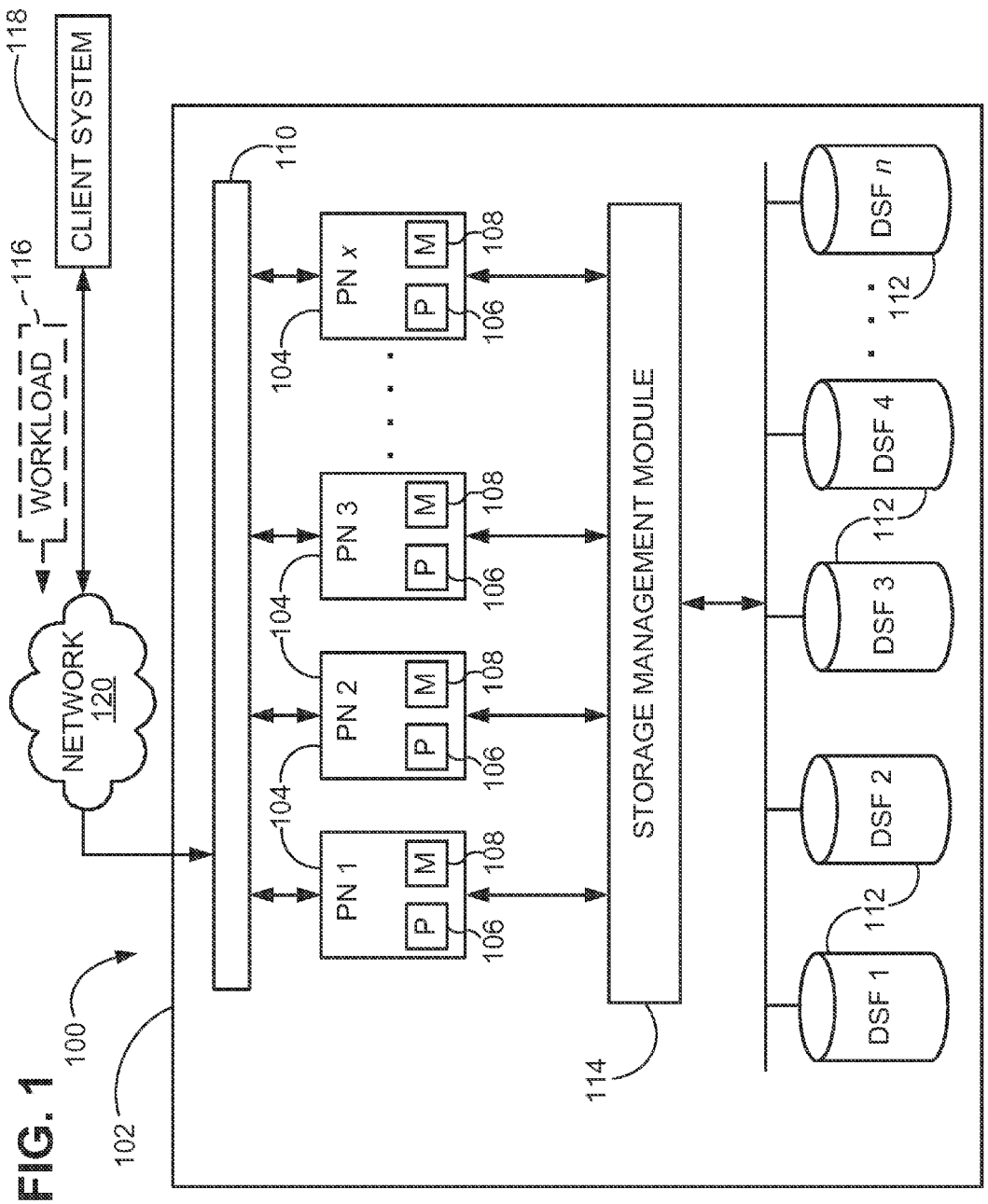
FIG. 1 is a block diagram of a database system.

FIG. 1 is a diagrammatic representation of example architecture for a database system 100. In one example, the database system 100 includes a relational database management system (RDBMS) 102 that implements a parallel-processing environment to carry out database management. The RDBMS 102 may be a combination of software (e.g., computer program routines, subroutines, applications, etc.) and hardware (e.g., processors, memories, etc.). In the example of FIG. 1, the RBDMS 102 may be a massive parallel processing (MPP) system having an array of processing units and distributed memory and storage. In alternative examples, the RBDMS 102 may implement a single processing unit, such as in a symmetric multiprocessing (SMP) system configuration.

The RBDMS 102 may include one or more processing units used to manage the storage, retrieval, and manipulation of data in the data-storage facilities. The array of processing units may include an array of processing nodes (PN) 104 that manage the storage, retrieval, and manipulation of data included in a database. In FIG. 1, the processing nodes 104 are individually indexed as PN 1 through PN x, where x may represent the total number of processing nodes 104 in the database system 100 or, alternatively, may represent the total number of active processing nodes 104 in the database system.

Each of the processing nodes 104 may include one or more processors 106 and one or memories 108. The memory 108 may include one or more memories and may be computer-readable storage media or memories, such as a cache, buffer, RAM, removable media, or other computer-readable storage media. Computer-readable storage media may include various types of volatile and non-volatile storage media. Various processing techniques may be implemented by processors, such as the processors 106, such as multiprocessing, multi-tasking, parallel processing and the like, for example.

Each of the processing nodes 104 may communicate with one another through a communication bus 110. The communication bus 110 allows communication to occur within and between each processing node 104. For example, implementation of the communication bus 110 provides media within and between each processing node 104 allowing communication among the various processing nodes 104 and other component processing units. The communication bus 110 may be hardware, software, or some combination thereof. In instances of at least a partial-hardware implementation of the communication, the hardware may exist separately from any hardware (e.g., processors, memory, physical wires, etc.) included in the processing nodes 104 or may use hardware common to the processing nodes 104. In instances of at least a partial-software implementation of the communication bus 110, the software may be stored and executed on one or more of the memories 108 and processors 106, respectively, of the processing nodes 104 or may be stored and executed on separate memories and processors that are in communication with the processing nodes 104. In one example, the communication bus 110 may include multi-channel media such that if one channel ceases to properly function, another channel may be used. Additionally or alternatively, more than one channel may also allow distributed communication to reduce the possibility of an undesired level of communication congestion among processing nodes 104.

The RDBMS 102 may include an array of data storage facilities (DSFs) 112. The DSFs 112 may include persistent storage devices such as hard disk drives, solid state drives, or any other suitable non-volatile storage devices where data may be persistently stored. The DSFs 112 may include various types of persistent storage devices with varying degrees of performance. Such degrees of performance may involve how quickly data can be retrieved from a particular DSF 112. In conventional databases, retrieval time of data is a crucial aspect of overall performance. Thus, it is more efficient to store database data most likely to be accessed with greater frequency than other database data in devices that allow faster retrieval. In FIG. 1, the DSFs 112 are individually indexed as 1 through n where n is the number of DSFs 112. In addition, location of stored data within each persistent storage device itself may also affect how quickly data may be retrieved from each persistent storage device.

Figure 2:
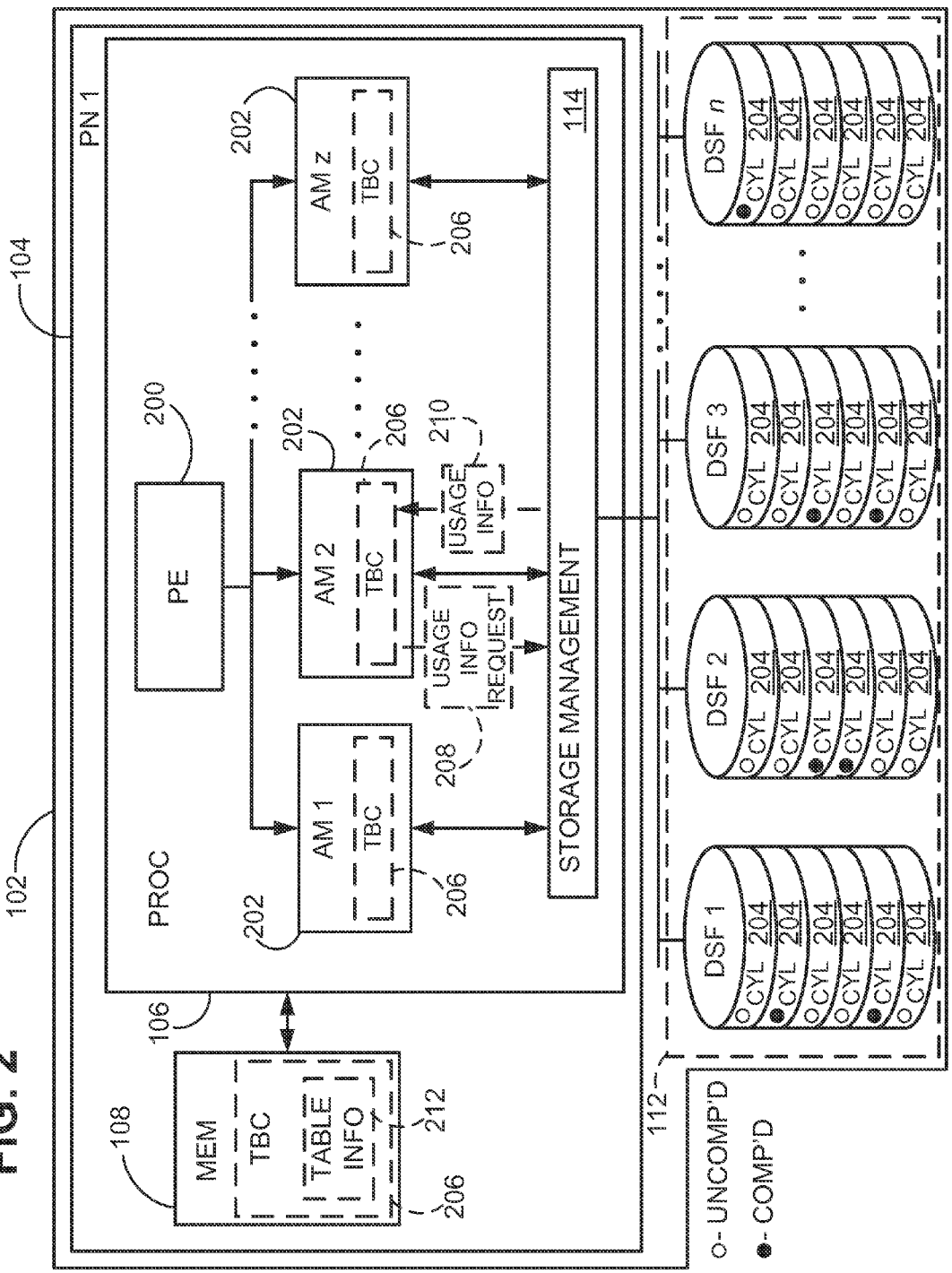
FIG. 2 is a block diagram of a portion of the database system of FIG. 1 during operation.

In one example, and as discussed in further detail with regard to FIG. 2, a storage management module 114 may determine on which persistent storage device(s) of the DSFs 112 that particular database data is to be stored. As described herein, "modules" are defined to include software, hardware or some combination thereof executable by one or more physical and/or virtual processors. Software modules may include instructions stored in the one or more memories that are executable by one or more processors. Hardware modules may include various devices, components, circuits, gates, circuit boards, and the like that are executable, directed, and/or controlled for performance by one or more processors.

During operation, a workload 116 may be initially transmitted via a client system 118 to the RBDMS 102. In one example, the workload 116 may be transmitted over a network 120. The network 120 may be wired, wireless, or some combination thereof. The network 120 may be a virtual private network, web-based, directly-connected, or some other suitable network configuration. In one example, the client system 118 may run a dynamic workload manager (DWM) client (not shown). Alternatively, the database system 100 may include a mainframe (not shown) used to interact with the RBDMS 102. The workload 116 may include one or more database tasks to be performed by the RBDMS 102. For example, the workload 116 may contain any combination of queries, database utilities (e.g., data insertion or deletion), as well as, any other type of database-related activity.

FIG. 2 is an example of a block diagram of a portion of the RBDMS 102 that includes a single processing node 104. Each processing node 104 may include one or more parsing engine (PE) modules 200 and one or more access modules (AM) 202. The access modules 202 are individually designated as AM 1 through AM z. In one example, the access modules 202 may be access module processors (AMPs), such as those implemented in the Teradata Active Data Warehousing System®. The parsing engine modules 200 and the access modules 202 may each be virtual processors (vprocs) and/or physical processors. In the case of vprocs, the parsing engine modules 200 and access modules 202 may be executed by one or more physical processors 106, such as those included in the processing nodes 104. For example, in FIG. 2, the parsing engine module 200 and access module 202 are associated with a respective processing node 104 and may each be executed as one or more vprocs by physical processors 106 included in the respective processing node 104. In FIG. 2, each processing node 104 is shown as including a single parsing engine module 200 and multiple access modules 202, such that there are more parsing engine modules 200 and access modules 202 total than overall processing nodes 104. In one example, during operation, the one or more physical processors 106 included in the processing nodes 104 may execute the parsing engine modules 200 and access modules 202 by switching between the executions of the various modules at a rapid rate allowing the vprocs to substantially operate in "parallel."

During operation, the parsing engine modules 200 may receive the workloads 116 and determine the content and generate instructions to execute tasks associated with the workloads 116. The parsing engine module(s) 200 processing the workload 116 may transmit specific instruction to access modules 202 having a common processing node 104 or a different one. These access modules 202 may execute the instructions in parallel to carry out activities related to the processed workload 116. In most scenarios, carrying out the activities includes accessing stored database information, such as database tables.

During operation, the storage management module 114 may arrange data in the DSFs 112 according to a frequency of data. In one example, frequency of data may include the frequency with which data in the DSFs 112 is accessed, as well as the "priority" of the data. The priority of the data may be identified by assigning the data an initial frequency of data value associated with the data as it is initially loaded into the RBDMS 102. The frequency of data may then be a value that is based on both the access frequency and the priority of the data.

The frequency of data may also be referred to as the "temperature" of the data. Reference to the temperature of the data allows a qualitative description of the quantitative frequency of data. Thus, the higher the frequency of data, the higher the "temperature" of the data. For example, data having a higher frequency of data compared to other data may be referred to as being "hotter" than the other data and the other data may be referred to as being "colder" compared to the data having the higher frequency of data. For purposes of this disclosure, reference to the "temperature value" or "data temperature value" of data may be considered as referring to the quantitative value of the frequency of data.

The storage management module 114 may evaluate data temperature at a particular level of granularity. For example, the storage management module 114 may evaluate data temperature at a "cylinder" level, such as that used in "Teradata Virtual Storage® (TVS)" systems by Teradata Corporation of Dayton, Ohio. In one example, a cylinder of data may be approximately 2 to 11 MB in size. A single cylinder may exist in one storage device or across multiple ones in the DSFs 112.

In FIG. 2, each DSF 112 may store multiple cylinders 204. The number of cylinders 204 shown for each DSF 112 is for purposes of example only. In practical implementations, each DSF 112 may store numerous cylinders 204 of data many orders of magnitudes greater than that shown. During operation, the database system 100 may store massive amounts of data in the DSFs 112. In order to optimize the storage capacity of the DSFs 112, data compression may be implemented.

During operation of the RBDMS 102, data may become hotter or colder relative to other data stored in the DSFs 112. In one example, this data may be database tables or portions of database tables. As data remains cold for extended periods of time, the likelihood that the data will not be accessed may also increase. In such scenarios, this data may be considered a desirable candidate for compression. Compressing and decompressing data uses resources of the database system 100. Thus, identification of data for compression that is relatively less likely to be accessed minimizes the likelihood that the data identified for compression will not require decompression or at least require less decompression relative to other data. Successful identification of such data allows resources to be used for other activities, which increases the efficiency of the database system 100.

In one example, the RBDMS 102 may identify and select database tables in the DSFs 112 for compression and decompression using data-temperature-based considerations and subsequently compress or decompress the selected tables. The database tables may be stored within the DSFs 112. Each cylinder 204 may contain at least some database data of one or more database tables. In FIG. 2, the RBDMS 102 may evaluate usage information associated with database data stored in the DSFs 112. The usage information may indicate how frequently database tables are accessed during operation of the database system 100.

Evaluation of the usage information may occur during predetermined periods of time or under predetermined system conditions. For example, if the database system 100 has a low level of usage during a specific period of time, such as off-peak hours, the RBDMS 102 may have available resources to evaluate usage data to determine if any data is a candidate for compression. In another example, the RBDMS 102 may evaluate usage data for compression-candidate data during specific system-operation conditions, such as when system resource usage is below a predetermined threshold value for a predetermined amount of time. In alternative examples, various time- and/or operation-based conditions may be used separately or in combination to trigger evaluation of usage data for potential compression.

Data objects containing the database data in the DSFs 112 may be preselected as candidates for compression. In one example, these data objects may be database tables. If a database table is preselected, the cylinders 204 storing the database table may be compressed based on predetermined compression/decompression conditions. Additionally, only portions of a database table may be compressed. Such arrangement allows specific portions of a database table that may be frequently accessed to be excluded from compression, such as specific columns that are frequently accessed, while allowing compression/decompression of the remaining portion of the database table. In alternative examples, all database tables may be considered for compression/decompression and may be selected for exclusion from any compression/decompression.

During operation, upon occurrence of a triggering event, a parsing engine module 200 may direct one or more access modules 202 to evaluate usage information associated with the DSFs 112 for compression/decompression candidates. In one example, the access modules 202 charged with evaluating the usage information for compression/decompression may execute a temperature-based compression (TBC) module 206. The TBC module 206 may be stored within the DSFs 112 or may be stored in another storage device accessible by the RBDMS 102. The TBC module 206 may be retrieved when appropriate and loaded into the memories 108 of processing nodes 104 involved with data-compression-related activities for use by the associated access modules 202.

In FIG. 2, the access module AM 2 is shown as evaluating usage information associated with database data stored in the DSFs 112 in order to identify and select candidate data for compression/decompression. In conducting the evaluation, the access module AM 2 may request the usage information for particular cylinders 204 from the storage management module 114 through a usage information request 208. Based on the usage information request 208, the storage management module 114 may return usage information 210 for the requested tables, which may represent data temperature values of each cylinder 204. The TBC module 206 may include table information 212, which provides the correspondence information between the database tables and the cylinders 204 in which they are stored. In alternative examples, such correspondence information may be provided by the storage management module 114 in the form of or in addition to the usage information 210.

Based on the usage information 210, which indicates how frequently each cylinder 204 is accessed, the TBC modules 206 may determine the data temperature values of the cylinders 204. The table information 212 may indicate correspondence between database tables and cylinders 204 and which database tables are included or excluded from compression/decompression operations. The manner in which cylinders 204 are selected for usage information requests 208 may be done based on various considerations. In one example, all usage information 210 may be evaluated for compression/decompression candidate data. In such scenarios, if evaluation of usage information 210 for all targeted data during a predetermined evaluation window is not completed, the access modules 202 may resume the evaluation at the next opportunity at the point in the usage information 210 where the inspection was suspended. This allows all targeted data to be fully evaluated before any data is reevaluated.

Compression threshold values may be used to determine whether or not data is to be compressed. The compression threshold may represent a particular data temperature value. In one example, the data temperature value of data being evaluated may be compared to the compression threshold. Data having data temperature values below the compression threshold may selected for compression. The compression threshold may be static or dynamic. In one example, the threshold may be based on a certain percentage of data temperature values. For example, the threshold for compression may be data temperature values falling into the bottom 20% of temperature values. Thus, any data having data temperature values in the bottom 20% of the overall data temperature values may be compressed. While the 20% may be a predetermined amount, the amount of data being compressed/decompressed may vary based on how much data is being stored at a particular time. The compression value may also be a predetermined data temperature value. The compression threshold may be system-wide so that it is used each time data is evaluated for compression. In alternative examples, such as those with database tables, the compression threshold may be table-specific, allowing each cylinder of each database table to be compressed/decompressed using a respective compression threshold.

Compression of data at levels of granularity relatively small compared to database table sizes allows partial-table compression to occur. For example, a database table may have particular portions that are accessed at a much greater frequency than the rest of the data in the database table. These more-frequently-accessed portions may be stored within one or more cylinders 204 different from the cylinders 204 containing other portions of the database table. During data evaluation, the cylinders 204 containing the more-frequently-accessed portions may be greater than the compression threshold, while the cylinders 204 containing other portions of the database table may be less than the compression threshold. The cylinders 204 containing these other portions may be compressed, while the cylinders 204 containing the more-frequently-accessed columns remain uncompressed. Thus, partial-table compression is carried out for the particular database table.

In operation, upon receipt of the usage data 210, the access module AM 2 may determine if the associated cylinders 204 are to be compressed/decompressed using the TBC module 206. In one example, based on the temperature values, the access module AM 2 may compress cylinders 204 containing data in the bottom 20% of data temperature. In alternative examples, threshold values may be static or may be dynamic based on various factors such as database system operation.

Figure 3:
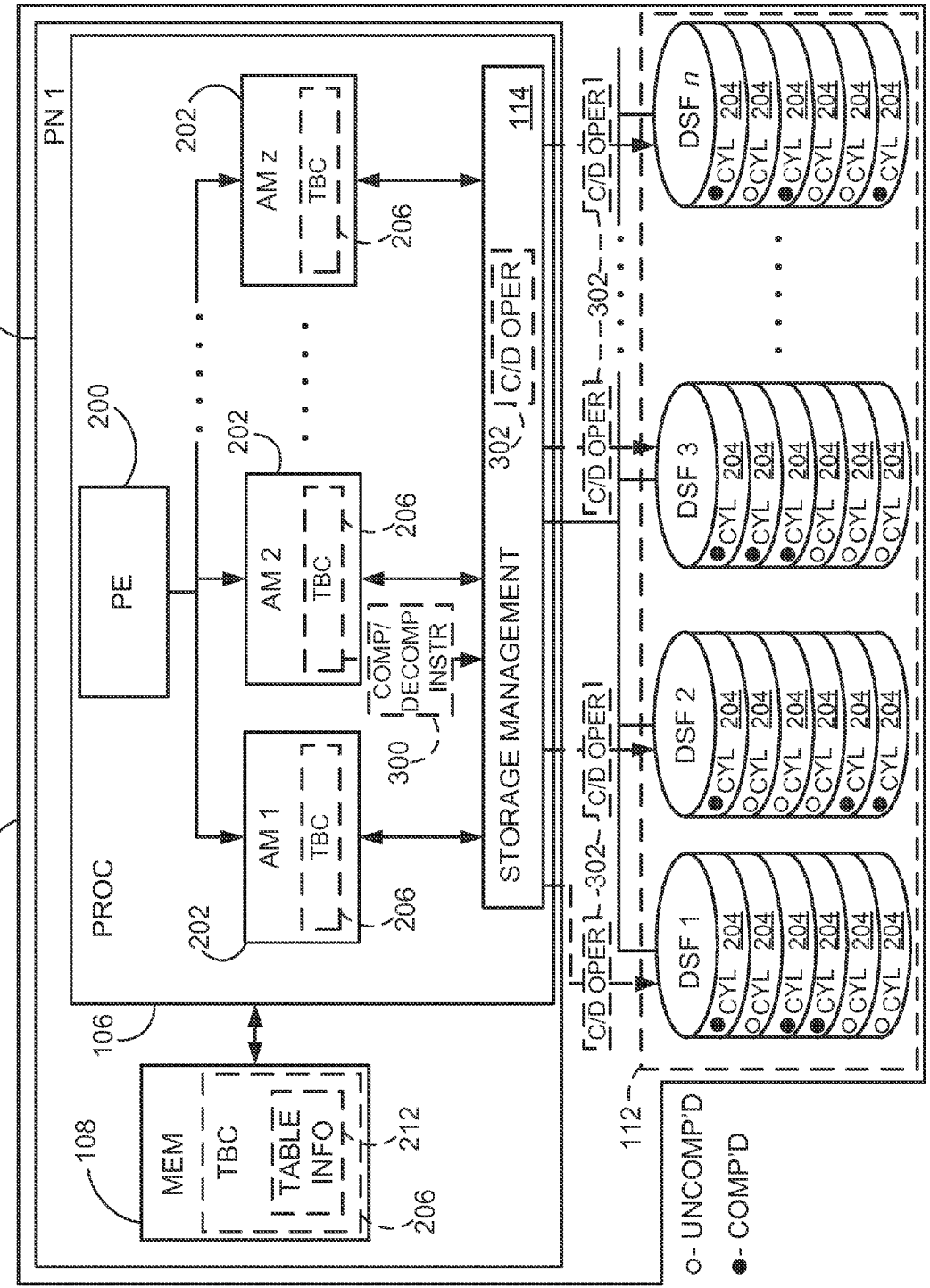
FIG. 3 is another block diagram of the portion of the database system of FIG. 1 during operation.

In FIG. 2, for purposes of illustration, each cylinder 204 includes an unfilled circle indicating that the cylinder 204 is uncompressed or a filled circle indicating that the cylinder 204 is compressed. In FIG. 2, some of the cylinders 204 are shown as being compressed from previous compression operations. After the access module AM 2 determines which cylinders 204 are to be compressed and/or decompressed, the access module AM 2 may transmit compression/decompression instructions 300 to the storage management module 114 as shown in FIG. 3. In FIG. 3, the compression/decompression (C/D) instructions 300 are shown as being a single batch of instructions. In alternative examples, the C/D instructions 300 may consist of different groups including instructions for compressing/decompressing one or more cylinders 204. Based on the contents of the C/D instructions 300, the storage management module 114 may perform various C/D operations 302 to compress selected cylinders in the DSFs 112. In FIG. 3, the compression/decompression status of the cylinders 204 is shown after the C/D operations 302 have been performed. In alternative examples, the access modules 202 may perform the compression/decompression directly on the cylinders 204. Various compression algorithms may be used to compress data within the cylinders. In one example, compression may be performed according to block level compression (BLC).

Figure 4:
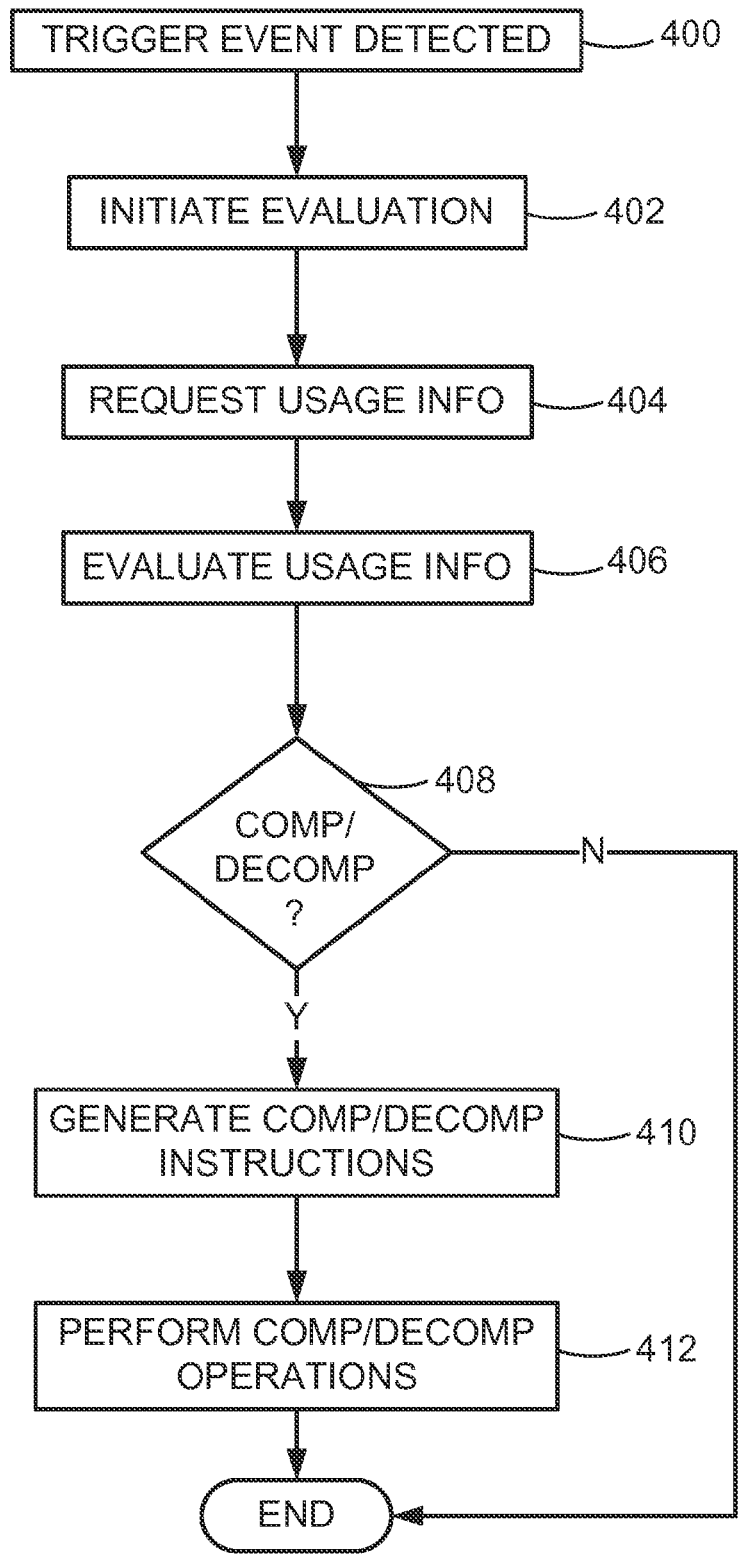
FIG. 4 is an operational flow diagram of the database system of FIG. 1.

FIG. 4 is an operational flow diagram of example temperature-based compression/decompression activities performed by the RBDMS 102. In one example, a trigger event for detecting compression/decompression opportunities may occur that is detected by the RBDMS 102 (400), such as by an access module 202. The trigger event may also be a time-based routine scheduled to occur at predetermined and/or routine times. Based on occurrence of the trigger event, the RBDMS 102 may initiate an evaluation of usage information (402). In one example, the evaluation may be performed by one or more access modules 202 using the TBC module 206.

Upon initiation, the access modules 202 may request the usage information 210 from the storage management module 114 (404). The usage information 210 may provide the data temperature values of database data at some predetermined level of data granularity, such as the cylinder level. Through the TBC modules 206, each access module 202 involved in potential compression/decompression may evaluate the usage information 210 (406). Evaluation of the usage information 210 may include establishing thresholds for compression/decompression. For example, the RBDMS 102 may establish a threshold such that the bottom 20% of database data in terms of frequency of data values are to be compressed. The access modules 202 may evaluate the usage information 210 to determine what the frequency of data value is for the 20% threshold. Evaluation may also include determining which data objects, such as database tables, correspond to the cylinder 204 under evaluation.

The access modules 202, via the TBC modules 206 may determine which cylinders 204, if any, are to be compressed or decompressed (408). The access modules 202 may then provide C/D instructions 300 to the storage management module 114 (410). Based on the instructions, the storage management module 114 may perform the C/D operations accordingly (412).

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A database system comprising:
   a storage array including a plurality of storage devices configured to store database data wherein the database data is stored across a plurality respective data units; and
   a processor in communication with the storage array, configured to:
   determine a proportion of database data to an amount of overall database data;
   determine usage frequency of the database data;
   select a subset of the database data for compression based on the usage frequency relative to usage frequency of at least one other subset of database data, wherein an amount of the database data in the subset is the proportion of database data; and
   perform the compression of the selected subset of the database data.

2. The database system of claim 1, wherein the processor is further configured to:
   determine the usage frequency of groups of database data based on respective access frequencies of groups of database data, wherein each group of database data is at a predetermined level of data granularity in the storage array; and
   select a group of database data based on the respective usage frequency relative to usage frequency of other groups, wherein the selected group of database data comprises the subset of database data.

3. The database system of claim 2, wherein the processor is further configured to:
   determine a threshold value based on the usage frequency of the database data;
   compare each determined usage frequency to the threshold value; and
   select each group of database data in response to the respective usage frequency being less than the predetermined threshold value, wherein the selected groups comprise the subset of the database data.

4. The database system of claim 1, wherein the database data comprises a database table, and wherein at least a portion of the subset of database data comprises less than all data in the database table.

5. The database system of claim 4, wherein the database data comprises a database table, and wherein at least a portion of the database data is preselected to be excluded from compression.

6. The database system of claim 1, wherein the processor is further configured to:
   identify a subset of compressed database data;
   determine the usage frequency of the compressed database data; and
   decompress the subset of the compressed database data based on the usage frequency.

7. The database system of claim 6, wherein the processor is further configured to:
   determine the usage frequency of groups of compressed database data based on respective access frequencies of groups of compressed database data, wherein each group of data is at a predetermined level of data granularity in the storage array;
   compare each determined usage frequency to a predetermined threshold value; and
   select each group of compressed database data in response to the respective usage frequency being greater than the predetermined threshold value, wherein the selected groups of compressed database data comprise the subset of compressed database data; and
   decompress the subset of compressed database data.

8. A method of operating a database system, the method comprising:
   determining, with a processor, usage frequency of database data stored in a storage array comprising a plurality of storage devices;
   determining, with the processor, a proportion of database data to an amount of overall database data;
   selecting, with the processor, a subset of the database data for compression based on the usage frequency relative to usage frequency of at least one other subset of database data, wherein an amount of the database data in the subset is the proportion of database data; and
   performing, with the processor, the compression of the selected subset of the database data.

9. The method of claim 8, wherein determining, with the processor, the usage frequency comprises determining, with the processor, the usage frequency of groups of database data based on respective usage frequencies of groups of database data, wherein each group of data is at a predetermined level of data granularity in the storage array, and wherein selecting, with the processor, the subset of the database data comprises selecting, with the processor, a group of database data based on the respective usage frequency relative to usage frequency of other groups, wherein the selected group of database data comprises the subset of the database data for compression.

10. The method of claim 9, further comprising:
    determining a threshold value based on the usage frequency of database data; and
    comparing, with the processor, each determined usage frequency to the threshold value, wherein selecting, with the processor, the group of database data based on the respective usage frequency comprises selecting, with the processor, the group of database data in response to the respective usage frequency being less than the predetermined threshold value, wherein the selected groups comprise the subset of the database data.

11. The method of claim 8, wherein the database data comprises a plurality of database tables, and wherein the method further comprises preselecting, with the processor, at least one database table for exclusion from compression in response to user-based input.

12. The method of claim 8, further comprising:
    identifying, with the processor, a subset of compressed database data, wherein a portion of the subset of compressed database data is preselected to be excluded from decompression;
    determining, with the processor, a usage frequency of the subset of the compressed database data;
    identifying, with the processor, the subset of compressed data as a candidate for decompression based on the determined usage frequency; and
    decompressing, with the processor, compressed database data in the subset that is not included in the portion of the subset of the compressed database excluded from decompression.

13. The method of claim 12, wherein determining, with the processor, the usage frequency of the compressed database data comprises determining, with the processor, the usage frequency of groups of compressed database data based on respective access frequencies of groups of compressed database data, wherein each group is at a predetermined level of data granularity in the storage array, wherein the method further comprises:
    comparing, with the processor, each determined usage frequency to a predetermined threshold value; and
    selecting, with the processor, each group of compressed database data in response to the respective usage frequency in response to the respective usage frequency being greater than the predetermined threshold value, wherein the subset of compressed database data comprises the selected groups of compressed database data; and
    decompressing, with the processor, the subset of compressed database data.

14. The method of claim 8 further comprising detecting, with the processor, a predetermined condition, wherein determining, with the processor, usage frequency of database data comprises determining, with a processor, usage frequency of database data stored in response to detection of the predetermined condition.

15. A non-transitory computer-readable medium encoded with a plurality of instructions executable by a processor, the plurality of instructions comprising:
    instructions to determine usage frequency of database data stored in a storage array comprising a plurality of storage devices;
    instructions to determine a proportion of database data to an amount of overall database data;
    instructions to select a subset of the database data for compression based on the usage frequency relative to usage frequency of at least one other subset of database data, wherein an amount of the database data in the subset is the proportion of database data; and
    instructions to perform the compression of the selected subset of the database data.

16. The non-transitory computer-readable medium of claim 15, wherein the instructions to determine the usage frequency comprise instructions to determine the usage frequency of groups of database data based on respective access frequencies of groups of database data, wherein each group of data is at a predetermined level of data granularity in the storage array, and wherein the instructions to select a subset of the database data comprise instructions to select a group of database data based on the respective usage frequency relative to usage frequency of other groups of database data, wherein the selected group of database data comprises the subset of the database data for compression.

17. The non-transitory computer-readable medium of claim 16, wherein the plurality of instructions further comprise:
  instructions to determine a threshold value based on the usage frequency of database data; and
  instructions to compare each determined usage frequency to the threshold value, wherein the instructions to select a group of database data based on the respective usage frequency comprise instructions to select each group of database data in response to the respective usage frequency being less than the predetermined threshold value, wherein the subset comprises the selected groups.

18. The non-transitory computer-readable medium of claim 15, wherein the database data comprises a plurality of database tables, and wherein the plurality of instructions further comprises instructions to preselect at least one database table for exclusion from compression in response to user-based input.

19. The non-transitory computer-readable medium of claim 15, wherein the plurality of instructions further comprises:
  instructions to identify a subset of compressed database data;
  instructions to determine the usage frequency of the compressed database data; and
  instructions to decompress the usage frequency of the compressed database data based on the usage frequency.

20. The non-transitory computer-readable medium of claim 19, wherein the instructions to determine the usage frequency of the compressed database data comprise instructions to determine the usage frequency of groups of compressed database data based on respective access frequencies of groups of compressed database data, wherein each group of data is at a predetermined level of data granularity in the storage array, wherein the plurality of instructions further comprises:
  instructions to compare each determined usage frequency to a predetermined threshold value;
  instructions to select each group of compressed database data in response to the respective usage frequency in response to the respective usage frequency being greater than the predetermined threshold value, wherein the subset of compressed database data comprises the selected groups of compressed database data; and
  instructions to decompress the subset of compressed database data.

* * * * *